United States Patent
Haskell et al.

(10) Patent No.: US 7,220,658 B2
(45) Date of Patent: May 22, 2007

(54) GROWTH OF REDUCED DISLOCATION DENSITY NON-POLAR GALLIUM NITRIDE BY HYDRIDE VAPOR PHASE EPITAXY

(75) Inventors: Benjamin A Haskell, Goleta, CA (US); Michael D. Craven, Goleta, CA (US); Paul T. Fini, Santa Barbara, CA (US); Steven P. DenBaars, Goleta, CA (US); James S. Speck, Goleta, CA (US); Shuji Nakamura, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 10/537,644

(22) PCT Filed: Jul. 15, 2003

(86) PCT No.: PCT/US03/21918

§ 371 (c)(1),
(2), (4) Date: Jun. 6, 2005

(87) PCT Pub. No.: WO2004/061909

PCT Pub. Date: Jul. 22, 2004

(65) Prior Publication Data

US 2006/0128124 A1 Jun. 15, 2006

Related U.S. Application Data

(60) Provisional application No. 60/433,843, filed on Dec. 16, 2002, provisional application No. 60/433,844, filed on Dec. 16, 2002.

(51) Int. Cl.
*H01L 21/20* (2006.01)
(52) U.S. Cl. ............................... 438/481; 257/E21.097

(58) Field of Classification Search ................ 438/481; 257/E21.097
See application file for complete search history.

(56) References Cited

U.S. PATENT DOCUMENTS

| | | | |
|---|---|---|---|
| 5,926,726 A | | 7/1999 | Bour et al. |
| 6,051,849 A | * | 4/2000 | Davis et al. ................ 257/103 |
| 6,153,010 A | * | 11/2000 | Kiyoku et al. ................ 117/95 |
| 6,156,581 A | | 12/2000 | Vaudo et al. |
| 6,177,057 B1 | | 1/2001 | Purdy |
| 6,177,292 B1 | | 1/2001 | Hong et al. |

(Continued)

FOREIGN PATENT DOCUMENTS

EP  0 942 459  9/1999

(Continued)

OTHER PUBLICATIONS

Amano, H. et al., "Stress and Defect Control in GaN Using Low Temperature Interlayers," Jpn. J. Appl. Phys. vol. 37 (1998), pp. L 1540-L 1542.

(Continued)

*Primary Examiner*—W. David Coleman
(74) *Attorney, Agent, or Firm*—Gates & Cooper LLP

(57) ABSTRACT

Lateral epitaxial overgrowth (LEO) of non-polar a-plane gallium nitride (GaN) films by hydride vapor phase epitaxy (HVPE) results in significantly reduced defect density.

21 Claims, 6 Drawing Sheets

U.S. PATENT DOCUMENTS

| | | |
|---|---|---|
| 6,180,270 B1 | 1/2001 | Cole et al. |
| 6,268,621 B1 | 7/2001 | Emmi et al. |
| 6,350,666 B2 | 2/2002 | Kryliouk |
| 6,413,627 B1 | 7/2002 | Motoki et al. |
| 6,441,391 B1 | 8/2002 | Ohno et al. |
| 6,468,882 B2 | 10/2002 | Motoki et al. |
| 6,582,986 B2 | 6/2003 | Kong et al. |
| 6,586,316 B2 | 7/2003 | Tsuda et al. |
| 6,602,763 B2 | 8/2003 | Davis et al. |
| 6,623,560 B2 | 9/2003 | Biwa et al. |
| 6,635,901 B2 | 10/2003 | Sawaki et al. |
| 6,645,295 B1 | 11/2003 | Koike et al. |
| 6,900,070 B2 | 5/2005 | Craven et al. |
| 2001/0029086 A1 | 10/2001 | Ogawa et al. |
| 2002/0047113 A1 | 4/2002 | Ohno et al. |
| 2003/0114017 A1* | 6/2003 | Wong et al. ............... 438/778 |
| 2004/0108513 A1 | 6/2004 | Narukawa et al. |
| 2004/0251471 A1 | 12/2004 | Dwilinski et al. |
| 2004/0261692 A1 | 12/2004 | Dwilinski et al. |
| 2006/0138431 A1 | 6/2006 | Dwilinski et al. |

FOREIGN PATENT DOCUMENTS

| | | |
|---|---|---|
| JP | 2001 257166 | 9/2001 |
| JP | 2002 076329 | 3/2002 |
| JP | 2002 076521 | 3/2002 |
| WO | WO 2004/061909 | 7/2004 |
| WO | WO 2004/061969 | 7/2004 |
| WO | WO 2005/064643 | 7/2005 |

OTHER PUBLICATIONS

Wang, F. et al., "Crystal Tilting in the Epitaxial Laterally Overgrown GaN Films on Sapphire Substrate by Hydride Vapor Phase Epitaxy", Solid State and Integrated-Circuit Technology Proceedings, 6th International Conference, Oct. 2001, vol. 2, pp. 1998-1201.

Maruska, H.P. et al., "Development of 50 mm Diameter Non-Polar Gallium Nitride Substrates for Device Applications", International Conference on Indium Phosphide and Related Materials, May 16, 2003, pp. 567-570.

Craven, M.D., et al., "Structural characterization of nonpolar (1120) α-plane GaN thin films grown on (1102) r-plane sapphire", Applied Physics Letters, vol. 81, No. 3, Jul. 15, 2002, pp. 469-471, XP002250684.

Dupuis, R.D., et al., "Selective-area and lateral epitaxial overgrowth of III-N materials by metalorganic chemical vapor deposition", Journal of Crystal Growth, vol. 195, No. 1-4, Dec. 15, 1998, pp. 340-345, XP004154285.

Grzegory, I., et al., "Seeded growth of GaN at high $N_2$ pressure on (0 0 0 1) polar surfaces of GaN single crystalline substrates", Materials Science in Semiconductor Processing, vol. 4, No. 6, Dec. 2001, pp. 535-541, XP004345737.

Liu, L. et al., "Substrates for gallium nitride epitaxy", Materials Science and Engineering R, Reports: A Review Journal, vol. 37, No. 3, Apr. 30, 2002, pp. 61-127, XP004349792.

Marchand, H., et al., "Mechanisms of lateral epitaxial overgrowth of gallium nitride by metalorganic chemical vapor deposition", Journal of Crystal Growth, vol. 195, No. 1-4, Dec. 15, 1998, pp. 328-332, XP004154283.

Mills, Alan, "Wide-bandgap emitters continue to improve", III-Vs Review, vol. 13, No. 3, May 2000, pp. 23-24, 26, 28-30, XP004200697.

Sasaki, T., et al., "Substrate-orientation dependence of GaN single-crystal films grown by metalorganic vapor-phase epitaxy", Journal of Applied Physics, American Institute of Physics, vol. 61, No. 7, Apr. 1, 1987, pp. 2533-2540, XP000820119.

Sun, Chien-Jen, et al., "Comparison of the physical properties of GaN thin films deposited on (0001) and (0112) sapphire substrates", Applied Physics Letters, vol. 63, No. 7, 1993, pp. 973-975, XP002251480.

Amano, H., et. al., "Metalorganic vapor phase epitaxial growth of a high quality GaN film using an AlN buffer layer" Appl. Phys. Lett. 48 (5), Feb. 3, 1986, pp. 353-355.

Ambacher, O., et. al., "Two-dimensional electron gases induced by spontaneous and piezoelectric polarization charges in N- and Ga-face AlGaN/GaN heterostructures" J. Appl. Phys., 85 (6), Mar. 15, 1999, pp. 3222-3233.

Bottcher, T., et al., "The role of high-temperature island coalescence in the development of stresses in GaN films" Appl. Phys. Lett. 78 (14), Apr. 2, 2001, pp. 1976-1978.

Brandt, O., et al., "Determination of strain state and composition of highly mismatched group-III nitride heterostructures by x-ray diffraction" J. Phys. D. Appl. Phys. 35 (2002), pp. 577-585.

Craven, M.D., et al., "Characterization of a-Plane GaN/(Al,Ga)N Multiple Quantum Wells Grown via Metalorganic Chemical Vapor Deposition" Jpn. J. Appl. Phys. vol. 42, (2003), pp. L235-L238.

Craven, M.D., et al., "Threading dislocation reduction via laterally overgrown nonpolar (1120) a-plane GaN" Appl. Phys. Lett. 81 (7), Aug. 12, 2002, pp. 1201-1203.

Dovidenko, K., et. al., Characteristics of stacking faults in AlN thin films J. Appl. Phys. 82 (9), Nov. 1, 1997, pp. 4296-4299.

Eastman, L.F., "The Toughest Transistor Yet" IEEE Spectrum 39 (5), May 2002, pp. 28-33.

Eddy, C.R., Jr., "Growth of gallium nitride thins films by electron cyclotron resonance microwave plasma-assisted molecular beam epitaxy" J. Appl. Phys. 73 (1), Jan. 1, 1993, pp. 448-455.

Etzkorn, E.V., et al., "Cracking of GaN films" J. Appl. Phys. 89 (2), Jan. 15, 2001, pp. 1025-1034.

Freitas, J. A., Jr., et al., "Optical characterization of lateral epitaxial overgrown GaN layers" Appl. Phys. Lett. 72 (23), Jun. 8, 1998, pp. 2990-2992.

Grandjean, N., et al., "Built-in electric-field effects in wurtzite AlGaN quantum wells" J. Appl. Phys. 86 (7), Oct. 1, 1999, pp. 3714-3720.

Heying, B., et al., "Role of threading dislocation structure on the x-ray diffraction peak widths in epitaxial GaN films" Appl. Phys. Lett. 68 (5), Jan. 29, 1996, pp. 643-645.

I. J. Seo, et. al., "Reduction of oscillator strength due to piezoelectric fields in GaN / $Al_xGa_{1-x}N$ quantum wells" Phys. Rev. B. 57 (16), Apr. 15, 1998-II, pp. R9435-R9438.

Iwata, K., et. al., "Gas Source Molecular Beam Epitaxy Growth of GaN on C-, A-, R-, and M-Plane Sapphire and Silica Glass Substrates" Jpn. J. Appl. Phys. vol. 36 (1997), pp. L 661-L664.

Kapolnek, D., et al., "Anisotropic epitaxial lateral growth in GaN selective area epitaxy" Appl. Phys. Lett. 71 (9), Sep. 1, 1997, pp. 1204-1206.

Langer, R., et. al., "Giant electric fields in unstrained GaN single quantum wells" Appl. Phys. Lett., 74 (25), Jun. 21, 1999, pp. 3827-3829.

Lefebvre, P. et al., "High internal electric field in a graded-width InGaN/GaN quantum well: Accurate determination by time-resolved photoluminescence spectroscopy" Appl. Phys. Lett. 78 (9), Feb. 26, 2001, pp. 1252-1254.

Lefebvre, P., et al., "Time-resolved photoluminescence as a probe of internal electric fields in GaN-(GaAl)N quantum wells" Phys. Rev. B. 59 (23), Jun. 15, 1999-I, pp. 15363-15367.

Lei, T., "Heteroepitaxy, polymorphism, and faulting in GaN thin films on silicon and sapphire substrates" J. Appl. Phys. 74 (7), Oct. 1, 1993, pp. 4430-4437.

Leroux, M., "Barrier-width dependence of group-III nitrides quantum-well transition energies" Phys. Rev. B. 60 (3), Jul. 15, 1991-I, pp. 1496-1499.

Leszczynski, M., et. al., "Lattice parameters of gallium nitride" Appl. Phys. Lett. 69 (1), Jul. 1, 1996, pp. 73-75.

Marchand, H., et al., "Microstructure of GaN laterally overgrown by metalorganic chemical vapor deposition" Appl. Phys. Lett.. 73 (6), Aug. 10, 1998, pp. 747-749.

Marchand, H., et al., "Atomic force microscopy observation of threading dislocation density reduction in lateral epitaxial overgrowth of gallium nitride by MOCVD" MRS Internet J. Nitride Semicond. Res. 3, 3 (1998), pp. 1-7.

Metzger, Th., et. al., "X-Ray Diffraction Study of Gallium Nitride Grown by MOCVD" Physica status solidi (b) 193, 1996, pp. 391-397.

B. Monemar, et. al., "Properties of Zn-doped VPE-grown GaN.I. Luminescence data in relation to doping conditions" J. Appl. Phys. 51 (1), Jan. 1980, pp. 625-639.

Moustakas, T.D., et. al., "Growth of GaN by ECR-assisted MBE" Physica B 185, 1993, pp. 36-49.

Motoki, J., et al., "Preparation of Large Freestanding GaN Substrates by Hydride Vapor Phase Epitaxy Using GaAs as a Starting Substrate" Jpn. J. Appl. Phys. vol. 40 (2), (2001), pp. L140-L143.

Nakamura, S, et. al., "Violet InGaN/GaN/AlGaN-Based Laser Diodes Operable at 50° C. with a Fundamental Transverse Mode" Jpn. J. Appl. Phys. 38 (2), 1999, pp. L226-L229.

Nam, O., et al., "Lateral epitaxy of low defect density GaN layers via organometallic vapor phase epitaxy" Appl. Phys. Lett. 71 (18), Nov. 3, 1997, pp. 2638-2640.

Nataf, G., et. al., "Lateral overgrowth of high quality GaN layers on GaN/$Al_2O_3$ patterned substrates by halide vapour-phase epitaxy" J. of Crystal Growth (192), Feb. 20, 1998, pp. 73-78.

Ng, H. M., "Molecular-beam epitaxy of GaN /$Al_xGa_{1-x}$N multiple quantum wells on R-plane (1012) sapphire substrates" Appl. Phys. Lett. 80 (23), Jun. 10, 2002, pp. 4369-4371.

Nishida, T., et al., "Ten Milliwatt Operation of an AlGaN-Based Light Emitting Diode Grown on GaN Substrate" Phys. Stat. Sol. (a) 188 (1), 2001, pp. 113-116.

Park, S., et al., "Spontaneous polarization effects in wurtzite GaN/AlGaN quantum wells and comparison with experiment" Appl. Phys. Lett. 76 (15), Apr. 10, 2000, pp. 1981-1983.

Park, J., et al., "Selective-area and lateral epitaxial overgrowth of III-N materials by metal organic chemical vapor deposition" Appl. Phys. Lett. 73 (3), Jul. 20, 1998, pp. 333-335.

Parilliaud, O., et al., "Localized Epitaxy of GaN by HVPE on patterned Substrates" MRS Internet J. Nitride Semicond. Res. 3 (40), Oct. 19, 1998, pp. 1-9.

Paskova, T., et al., "Defect Reduction in HVPE Growth of GaN and Related Optical Spectra" Phys. Stat. Sol. (a) 183, (2001), pp. 197-203.

Rosner, S.J., et. al., "Cathodoluminescence mapping of epitaxial lateral overgrowth in gallium nitride" Appl. Phys. Lett. 74 (14), Apr. 5, 1999, pp. 2035-2037.

Sakai, A., et al., "Self-organized propagation of dislocations in GaN films during epitaxial lateral overgrowth" Appl. Phys. Lett. 76 (4), Jan. 24, 2000, pp. 442-444.

Sano, M., et al., "Epitaxial Growth of Undoped and Mg-Doped GaN" Jpn. J. of Appl. Phys. 15 (10), Oct. 1976, pp. 1943-1950.

Shintani, A., et al. "Light Emitting Patterns of Gallium Nitride Electroluminescence" J. Electrochem. Soc. 123 (10), Oct. 1976, pp. 1575-1578.

Smorchkova, I.P., et. al., "Polarization-induced charge and electron mobility in AlGaN/GaN heterostructures grown by plasma-assisted molecular-beam epitaxy" J. Appl. Phys. 86 (8), Oct. 15, 1999, pp. 4520-4526.

Takeuchi, T., et. al., "Determination of piezoelectric fields in strained GaInN quantum wells using the quantum-confined Stark effect" Appl. Phys. Lett. 73 (12), Sep. 21, 1998, pp. 1691-1693.

Takeuchi, T., et. al., "Quantum-Confined Stark Effect due to Piezoelectric Fields in GaInN Strained Quantum Wells" Jpn. J. Appl. Phys. vol. 36, Apr. 1, 1997, pp. L382-385.

Tan, I-H., et. al., "A self consistent solution of Schrodinger-Poisson equations using a nonuniform mesh" J. Appl. Phys. 68 (8), Oct. 15, 1990, pp. 4071-4076.

Tsuchiya, H., et al., "Growth condition dependence of GaN crystal structure on (0 0 1)GaAs by hydride vapor-phase epitaxy" J. of Crystal Growth (189/190), 1998, pp. 395-400.

Waltereit, P., et. al., "Nitride semiconductors free of electrostatic fields for efficient white light-emitting diodes" Nature vol. 406, Aug. 24, 2000, pp. 865-868.

Wright, A.F., "Elastic properties of zinc-blende and wurtzite AlN, GaN, and InN" J. Appl. Phys. 82 (6), Sep. 15, 1997, pp. 2833-2839.

Yablonovitch, E., et. al., "Reduction of Lasing Threshold Current Density by the Lowering of Valence Band Effective Mass" J. of Lightwave Tech. vol. LT-4 (5), May 1986, pp. 504-506.

Zheleva, T., et. al., "Dislocation density reduction via lateral epitaxy in selectively grown GaN structures" Appl. Phys. Lett. 71 (17), Oct. 27, 1997, pp. 2472-2474.

Zheleva, T., et. al., "Pendo-epitaxy- A new appproach for lateral growth of gallium nitride structures" MRS Internet J. Nitride Semicond. Res. 4S1, G3.38 (1999).

Yu., Z., et. al., "Epitaxial lateral overgrowth of GaN on SiC and sapphire substrates" MRS Internet J. Nitride Semicond. Res. 4S1, G4.3 (1999).

Kinoshita et al., "Emission Enhancement of GaN/AlGaN Single-Quantum-Wells Due to Screening of Piezoelectric Field", MRS Internet J. Nitride Semicond. Res. 5, W11.32 (2000).

Leroux et al., "Quantum confined Stark effect due to built-in internal polarization fields in (Al,Ga)N/GaN quantum wells", Phys. Rev. B 58, R113371 (1998).

Kuokstis et al., "Polarization effects in photoluminescence of C- and M-plane GaN/AlGaN multiple quantum wells", Appl. Phys. Lett. 81, 4130 (2002).

Bhattacharyya et la., "Comparative study of GaN/AlGaN MQWs grown homoepitaxially on (1 1 0 0 ) and (0001) GaN", Crystal Growth 251, 487 (2003).

Bernardini et al., "Spontaneous polarization and piezoelectric constants of III-V nitrides", Phys. Rev. B 56, R10024 (1997).

Langer et al., "Giant electric fields in unstrained GaN single quantum wells", Appl. Phys. Lett. 74, 3827 (1999).

Traetta et al., "Effects of the spontaneous polarization and piezoelectric fields on the luminescence spectra of GaN/$Al_{0.15}Ga_{0.85}$N quantum wells", Physica E 7, 929-933 (2000).

Keller et al., "Metalorganic Chemical Vapor Deposition Growth of High Optical Quality and High Mobility GaN", J. Electronic Materials vol. 24, pp. 1707-1709 (1995).

Chakraborty et al., "Nonpolar InGaN/GaN emitters on reduced-defect lateral epitaxially overgrown a-plane GaN with drive-current-independent electroluminescence emission peak", Applied Physics Letters vol. 85 No. 22, (Nov. 29, 2004).

Chitnis et al., "Visible light-emitting diodes using a-plane GaN-InGaN multiple quantum wells over r-plane sapphire", Applied Physics Letters vol. 84 No. 18 (May 3, 2004).

Gardner et al., "Polarization anisotropy in the electroluminescence of m-plane InGaN-GaN multiple-quantum-well light-emitting diodes", Applied Physics Letters 86, 111101 (2005).

Vanfleet et al., "Defects in m-face GaN films grown in halide vapor phase epitaxy on $LiAlO_2$", Applied Physics Letters, vol. 83 No. 6 (Aug. 11, 2003).

Haskell et al., "Defect reduction in (1120) a-plane gallium nitride via lateral epitaxial overgrowth by hydride vapor-phase epitaxy", Applied Physics Letters, vol. 83 No. 4 (Jul. 28, 2003).

Yue Jun Sun et al., "In surface segregation in M-plane (In,Ga)N/GaN multiple quantum well structures", Applied Physics Letters, vol. 83 No. 25 (Dec. 22, 2003).

Bigenwald et al., "Confined Excitons in GaN-AlGaN Quantum Wells", Phys. Stat. Sol. (b) 216, 371 (1999).

Im, J.S. et al., "Reduction of oscillator strength due to piezoelectric fields in GaN/$Al_xGa_{1-x}$N quantum wells", Phys. Rev. B, vol. 57 No. 16 (Apr. 15, 1998).

Nam, Ok-Hyun et al., "Lateral epitaxy of low defect density GaN layers via organometallic vapor phase epitaxy", Appl. Phys. Lett 71 (18) (Nov. 3, 1997).

Zheleva et al., "Dislocation density reduction via lateral epitaxy in selectively grown GaN structures", Appl. Phys. Lett. 71 (17) (Oct. 27, 1997).

Yue Jun Sun et al., "Nonpolar $In_xGa_{1-x}$N/GaN (1100) multiple quantum wells grown on γ-$LiAlO_2$(100, by plasma-assisted molecular-beam epitaxy", Physical Review B 67 (2003).

Takeuchi et al., "Theoretical Study of Orientation Dependence of Piezoelectric Effects in Wurtzite Strained GaInN/GaN Heterostructures and Quantum Wells", Jpn. J. Appl. Phys. vol. 39, pp. 413-416, Part 1, No. 2A (Feb. 2000).

Grandjean et al., "Self-limitation of AlGaN/GaN quantum well energy by built-in polarization field", Applied Physics Letters, vol. 74, No. 16 (Apr. 19, 1999).

Amano et la., "Stress and Defect Control in GaN Using Low Temperature Interlayers", Jpn. J. Appl. Phys., vol. 37 (1998).

Mukai et al., "Ultraviolet InGaN and GaN Single-Quantum-Well-Structure Light-Emitting Diodes Grown on Epitaxially Laterally Overgrown GaN Substrates", Jpn. J. Appl. Phys., vol. 38, pp. 5735-5739 (1999).

Miller et al., "Electric field dependence of optical absorption near the band gap of quantum-well structures", The American Physical Society, Physical Review B, vol. 32, No. 2 (Jul. 15, 1985).

Pearton et al., "GaN: Processing, defects, and devices", Applied Physics Reviews, Journal of Applied Physics, vol. 86, No. 1 (Jul. 1, 1999).

S. Nakamura and G. Fasol, The Blue Laser Diode, (Springer, Heidelberg, 1997), pp. 160-178.

T. Gehrke et al., "Pendeo-Epitaxy of Gallium Nitride and Aluminum Nitride Films and Heterostructure on Silicon Carbide Substrate," MRS Internet J. Semicond. Res. 4S1, G3.2, 1999, 6 pp.

M. Iwaya et al., "Reduction of Etch Pit Density in Organometallic Vapor Phase Epitaxy-Grown GaN on Sapphire by Insertion of a Low-Temperature-Deposited Buffer Layer Between High Temperature-Grown GaN," Jpn. J. Appl. Phys., 1998, 37: L316-L318.

S. Keller et al., "Spiral Growth of InGaN Nanoscale Islands on GaN," Jpn. J. Appl. Phys., 1998, 37: L431-L434.

P. Kozodoy et al., "Electrical Characterization of GaN *p-n* Junctions With and Without Threading Dislocations," Appl. Phys. Lett., 1998, 73(7): 975-977.

S. Nakamura et al., "InGaN/GaN/AlGaN-Based Laser Diodes with Modulation-Doped Strained-Layer Superlattices Grown on an Epitaxially Laterally Overgrown GaN Substrate," Appl. Phys. Lett., 1998, 72(2): 211-213.

G. Parish et al., "High-Performance (Al,Ga) N-Based Solar-Blind Ultraviolet *p-i-n* Detectors on Laterally Epitaxially Overgrown GaN," Appl. Phys. Lett., 1999, 75(2): 247-249.

V. Srikant et al., "Mosaic Structure in Epitaxial Thin Films Having Large Lattice Mismatch," J. Appl. Phys., 1997, 82(9): 4286-4295.

S. Tanaka et al., "Anti-Surfactant in III-Nitride-Epitaxy—Quantum Dot Formation and Dislocation Terrmination," Jpn. J. Appl. Phys., 2000, 39: L831-L834.

S. Tanaka et al., "Self-Assembling GaN Quantum Dots on $Al_xGa_{1-x}N$ Surfaces Using a Surfactant," Appl. Phys. Lett., 1996, 69(26): 4096-4098.

A. Usui et al., "Thick GaN Epitaxial Growth with Low Dislocation Density by Hydride Vapor Phase Epitaxy," Jpn. J. Appl. Phys., 1997, 36: L899-L902.

Waltereit et al., "M-Plane GaN(1 1 0 0) Grown on $\gamma$-$LiAlO_2$(1 0 0): Nitride Semiconductors Free of Internal Electrostatic Fields," Journal of Crystal Growth 227-228 (2001), pp. 437-441.

Ajoul et al., "Hydrogen and Nitrogen Ambient Effects on Epitaxial Growth of GaN by Hydride Vapour Phase Epitaxy," Journal of Crystal Growth 230 (2001), pp. 372-376.

Nichizuka, K., "Efficient Radiative Recombination From <1122>-oriented InxGa1-xN Multiple Quantum Wells Fabricated by the Regrowth Technique," Applied Physics Letters, Oct. 2004, vol. 85, No. 15, pp. 3122-3124, abstract.

Sharma, R., "Demonstration of a Semipolar (1013) InGaN/GaN Green Light Emitting Diode," Applied Physics Letters, Nov. 2005, vol. 87, 231110, pp. 1-3, abstract.

\* cited by examiner

GROWTH OF REDUCED DISLOCATION DENSITY NON-POLAR GALLIUM NITRIDE BY HYDRIDE VAPOR PHASE EPITAXY

CROSS-REFERENCE TO RELATED APPLICATIONS

This application claims priority to the following co-pending and commonly-assigned U.S. Provisional Patent Applications:

Ser. No. 60/433,843, entitled "GROWTH OF REDUCED DISLOCATION DENSITY NON-POLAR GALLIUM NITRIDE BY HYDRIDE VAPOR PHASE EPITAXY," filed on Dec. 16, 2002, by Benjamin A. Haskell, Michael D. Craven, Paul T. Fini, Steven P. DenBaars, James S. Speck, and Shuji Nakamura, and Ser. No. 60/433,844, entitled "TECHNIQUE FOR THE GROWTH OF PLANAR, NON-POLAR A-PLANE GALLIUM NITRIDE BY HYDRIDE VAPOR PHASE EPITAXY," filed on Dec. 16, 2002, by Benjamin A. Haskell, Paul T. Fini, Shigemasa Matsuda, Michael D. Craven, Steven P. DenBaars, James S. Speck, and Shuji Nakamura, both of which applications are incorporated by reference herein.

This application is related to co-pending and commonly-assigned International Application No. PCT/US03/21916, entitled "GROWTH OF PLANAR, NON-POLAR A-PLANE GALLIUM NITRIDE BY HYDRIDE VAPOR PHASE EPITAXY," filed on same date herewith, by Benjamin A. Haskell, Paul T. Fini, Shigemasa Matsuda, Michael D. Craven, Steven P. DenBaars, Jamnes S. Speck, and Shuji Nakamura, which application claims priority to co-pending and commonly-assigned U.S. Provisional Patent Application Ser. No. 60/433,844, entitled "TECHNIQUE FOR THE GROWTH OF PLANAR, NON-POLAR A-PLANE GALLIUM NITRIDE BY HYDRIDE VAPOR PHASE EPITAXY," filed on Dec. 16, 2002, by Benjamin A. Haskell, Paul T. Fini, Shigemasa Matsuda, Michael D. Craven, Steven P. DenBaars, James S. Speck, and Shuji Nakamura, and U.S. Provisional Patent Application Ser. No. 60/433,843, entitled "GROWTH OF REDUCED DISLOCATION DENSITY NON-POLAR GALLIUM NITRIDE BY HYDRIDE VAPOR PHASE EPITAXY," filed on Dec. 16, 2002, by Benjamin A. Haskell, Michael D. Craven, Paul T. Fini, Steven P. DenBaars, James S. Speck, and Shuji Nakamura, which applications are incorporated by reference herein.

FIELD OF THE INVENTION

The invention is related to semiconductor materials, methods, and devices, and more particularly, to the growth of reduced dislocation density non-polar gallium nitride (GaN) by hydride vapor phase epitaxy (HVPE).

DESCRIPTION OF THE RELATED ART (Note: This application references a number of different patents, applications and/or publications as indicated throughout the specification by one or more reference numbers. A list of these different publications ordered according to these reference numbers can be found below in the section entitled "References." Each of these publications is incorporated by reference herein.)

The usefulness of gallium nitride (GaN) and its ternary and quaternary compounds incorporating aluminum and indium (AlGaN, InGaN, AlInGaN) has been well-established for fabrication of visible and ultraviolet optoelectronic devices and high-power electronic devices. (See References 1–3.) These devices are typically grown epitaxially, layer by layer oriented to a substrate, by growth techniques including molecular beam epitaxy (MBE), metalorganic chemical vapor deposition (MOCVD), or hydride vapor phase epitaxy (HVPE).

GaN and its alloys are most stable in the hexagonal würtzite crystal structure, in which the crystal is described by two (or three) equivalent basal plane axes that are rotated 120° with respect to each other (the a-axes), all of which are perpendicular to a unique c-axis. FIG. 1 is a schematic of a generic hexagonal würtzite crystal structure 100 and planes of interest 102, 104, 106, 108 with these axes 110, 112, 114, 116 identified therein.

As a consequence of the gallium and nitrogen atom positions within the würtzite crystal structure 100, any plane of atoms lying perpendicular to the c-axis will contain only one type of atom. As one proceeds from plane to plane along the c-axis, each plane will contain only one type of atoms, either Ga or N. In order to maintain charge neutrality, GaN crystals terminate with one c-face that contains only nitrogen atoms (the N-face), and one c-face that only contains gallium atoms (the Ga-face). As a consequence, GaN crystals are polarized along the c-axis. The spontaneous polarization of these crystals is a bulk property and depends on the structure and composition of the crystal.

Due to the relative ease of growing planar Ga-face c-planes, virtually all GaN-based devices are grown parallel to the polar c-axis. A negative consequence of this growth direction is that each layer material will suffer from segregation of electrons and holes to opposite faces of the layers due to the spontaneous polarization of the crystal. Furthermore, strain at the interfaces between adjacent layers gives rise to piezoelectric polarization, causing further charge separation within quantum heterostructures. Such polarization effects decrease the likelihood that electrons and holes will interact, a necessity for the operation of light-emitting optoelectronic devices. It is believed that the efficiency of GaN light-emitting devices would be enhanced were it possible to eliminate the polarization effects inherent to c-axis oriented devices.

One possible approach to eliminating the piezoelectric polarization effects in GaN optoelectronic devices is to grow the devices on non-polar planes of the crystal. (See References 4–6.) Such planes contain equal numbers of Ga and N atoms and are charge-neutral. Furthermore, subsequent non-polar layers are equivalent to one another so the bulk crystal will not be polarized along the growth direction. One such family of symmetry-equivalent non-polar planes in GaN is the $\{11\bar{2}0\}$ family, known collectively as a-planes. Growth on electronic devices, such as high electron mobility transistors; or optoelectronic devices, such as visible and ultraviolet laser diodes and light-emitting diodes; on a-plane substrates could yield significantly enhanced device performance compared to equivalent devices grown on c-plane GaN.

Bulk crystals of GaN are not available so it is not possible to simply cut a crystal to present a surface for subsequent device regrowth. All GaN films are initially grown heteroepitaxially, i.e. on foreign substrates that provide a reasonable lattice match to GaN. In recent years, a number of research groups have found it possible to utilize HVPE as a means of heteroepitaxially depositing c-plane GaN films that are thick enough (>200 μm) to remove the foreign substrate, yielding a free-standing GaN substrate that may then be used for homoepitaxial device regrowth by MBE and MOCVD. (See References 7–8.)

HVPE has the advantage of growth rates that are one to two orders of magnitude greater than that of MOCVD and as many as three orders of magnitude greater than MBE, an advantage that makes it an attractive technique for substrate fabrication.

The growth of planar a-plane GaN by HVPE has recently been demonstrated, as described in the co-pending and commonly-assigned International Application No. PCT/US03/21916, entitled "GROWTH OF PLANAR, NON-POLAR A-PLANE GALLIUM NITRIDE BY HYDRIDE VAPOR PHASE EPITAXY," filed on same date herewith, by Benjamin A. Haskell, Paul T. Fini, Shigemasa Matsuda, Michael D. Craven, Steven P. DenBaars, James S. Speck, and Shuji Nakamura, which application claims priority to co-pending and commonly-assigned U.S. Provisional Patent Application Ser. No. 60/433,844, entitled "TECHNIQUE FOR THE GROWTH OF PLANAR, NON-POLAR A-PLANE GALLIUM NITRIDE BY HYDRIDE VAPOR PHASE EPITAXY," filed on Dec. 16, 2002, by Benjamin A. Haskell, Paul T. Fini, Shigemasa Matsuda, Michael D. Craven, Steven P. DenBaars, James S. Speck, and Shuji Nakamura, and U.S. Provisional Patent Application Ser. No. 60/433,843, entitled "GROWTH OF REDUCED DISLOCATION DENSITY NON-POLAR GALLIUM NITRIDE BY HYDRIDE VAPOR PHASE EPITAXY," filed on Dec. 16, 2002, by Benjamin A. Haskell, Michael D. Craven, Paul T. Fini, Steven P. DenBaars, James S. Speck, and Shuji Nakamura, which applications are incorporated by reference herein. (See References 9–10.)

While this work represents an enabling technology for the growth of non-polar GaN devices, the relatively high defect density in the directly-grown a-GaN films reduces the efficiency of subsequently grown devices compared to what could be achieved by homoepitaxial growth on a perfect substrate. There is an ever-increasing effort to reduce the dislocation density in GaN films in order to improve device performance.

The two predominant types of extended defects of concern are threading dislocations and stacking faults. The primary means of achieving reduced dislocation and stacking fault densities in polar c-plane GaN films is the use of a variety of lateral overgrowth techniques, including lateral epitaxial overgrowth (LEO, ELO, or ELOG), selective area epitaxy, and PENDEO® epitaxy. The essence of these processes is to block or discourage dislocations from propagating perpendicular to the film surface by favoring lateral growth over vertical growth. These dislocation-reduction techniques have been extensively developed for c-plane GaN growth by HVPE and MOCVD. (See References 11–18.)

Only recently have GaN lateral growth techniques been demonstrated for a-plane films. Craven, et al., succeeded in performing LEO using a dielectric mask on a thin a-plane GaN template layer via MOCVD. (See Reference 19.)

However, HVPE-based LEO of a-plane GaN has not previously been accomplished. Thus, there is a need in the art for methods of growing high-quality, low-defect density, non-polar, a-plane $\{11\bar{2}0\}$ GaN films. More specifically, there is a need in the art for methods of growing such GaN films using lateral overgrowth by HVPE. The present invention satisfies this need.

SUMMARY OF THE INVENTION

The present invention discloses a method of performing a lateral epitaxial overgrowth of a planar, non-polar, a-plane GaN film, comprising: (a) patterning a mask deposited on a substrate; and (b) performing a lateral epitaxial overgrowth of the GaN film off the substrate using hydride vapor phase epitaxy, wherein the GaN film nucleates only on portions of the substrate not covered by the patterned mask, the GaN film grows vertically through openings in the patterned mask, and the GaN film then spreads laterally above the patterned mask and across the substrate's surface. The lateral epitaxial overgrowth reduces threading dislocation densities in the GaN film.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

The present invention reduces threading dislocation densities in HVPE-grown non-polar, a-plane GaN films using LEO. By utilizing reduced growth pressures and a carrier gas containing a fraction of hydrogen, lateral growth of a non-polar GaN film directly off a foreign substrate can be achieved. A patterned mask is applied to the substrate through one of a variety of means. The substrate is then loaded into a HVPE reactor and the a-GaN film grows only from the regions of exposed substrate material and spreads laterally above the mask and across the substrate surface.

The present invention allows significant defect reduction and film quality improvement, as compared to non-polar GaN films grown directly on uniform substrates. Such reduced defect density non-polar GaN films will provide for improvements in the electronic, optoelectronic, and electromechanical devices that are subsequently grown on the template films grown by this technique. Moreover, the laterally overgrown films described herein further provide an excellent means of reducing the dislocation density in thick non-polar GaN films that can be debonded to form free-standing substrates.

The preferred embodiment of the present invention for dislocation reduction includes:

1. Use of a patterned substrate, such as an r-plane sapphire ($Al_2O_3$) substrate with a silicon dioxide ($SiO_2$) mask containing apertures or stripes therein allowing access to the underlying sapphire substrate.

2. Growth of a non-polar GaN film under conditions that yield planar non-polar GaN films on the sapphire substrate.

Process Steps

Figure 1:
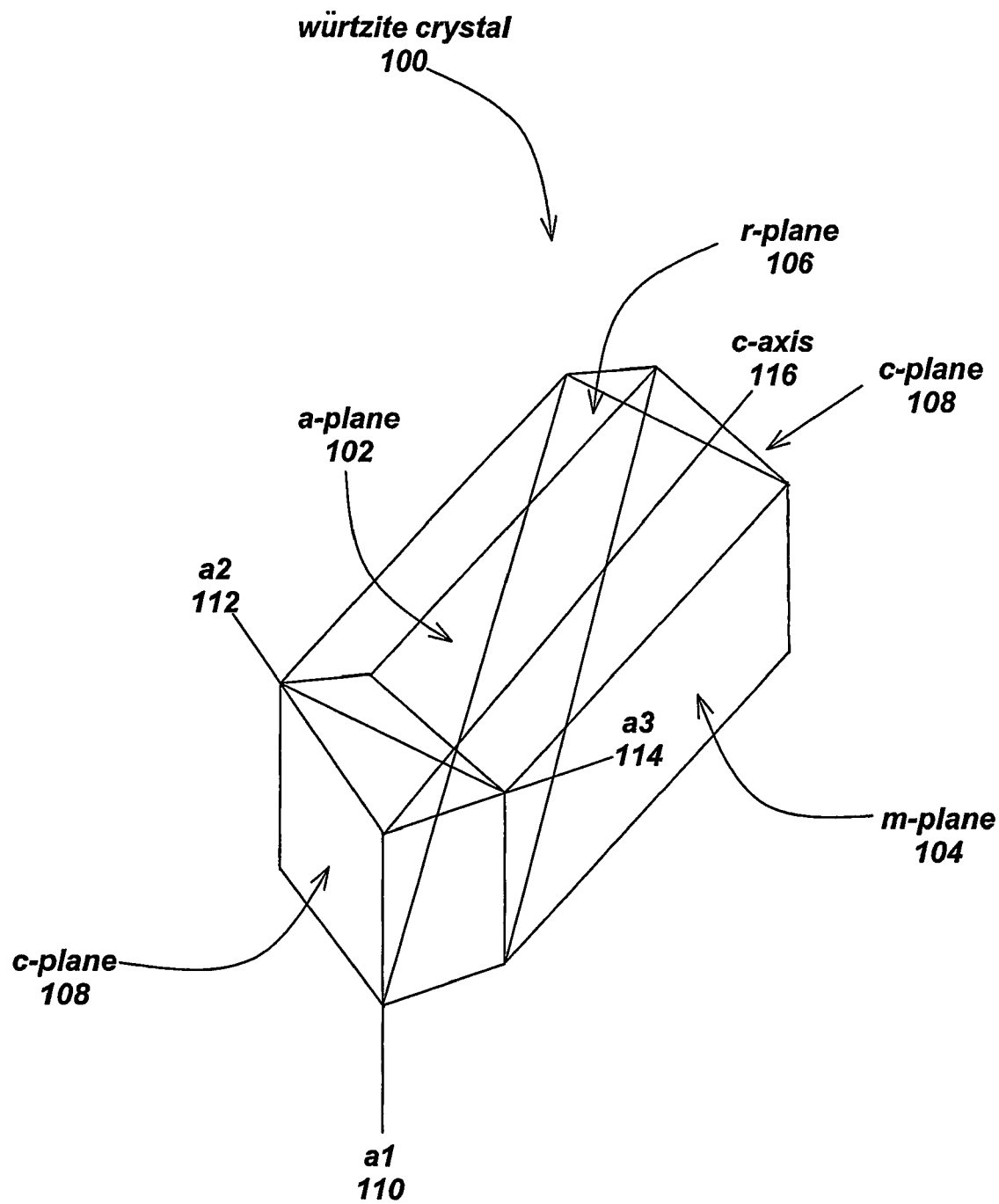
FIG. 1 is a schematic of a generic hexagonal würtzite crystal structure and planes of interest with these axes identified therein.
Figure 2:
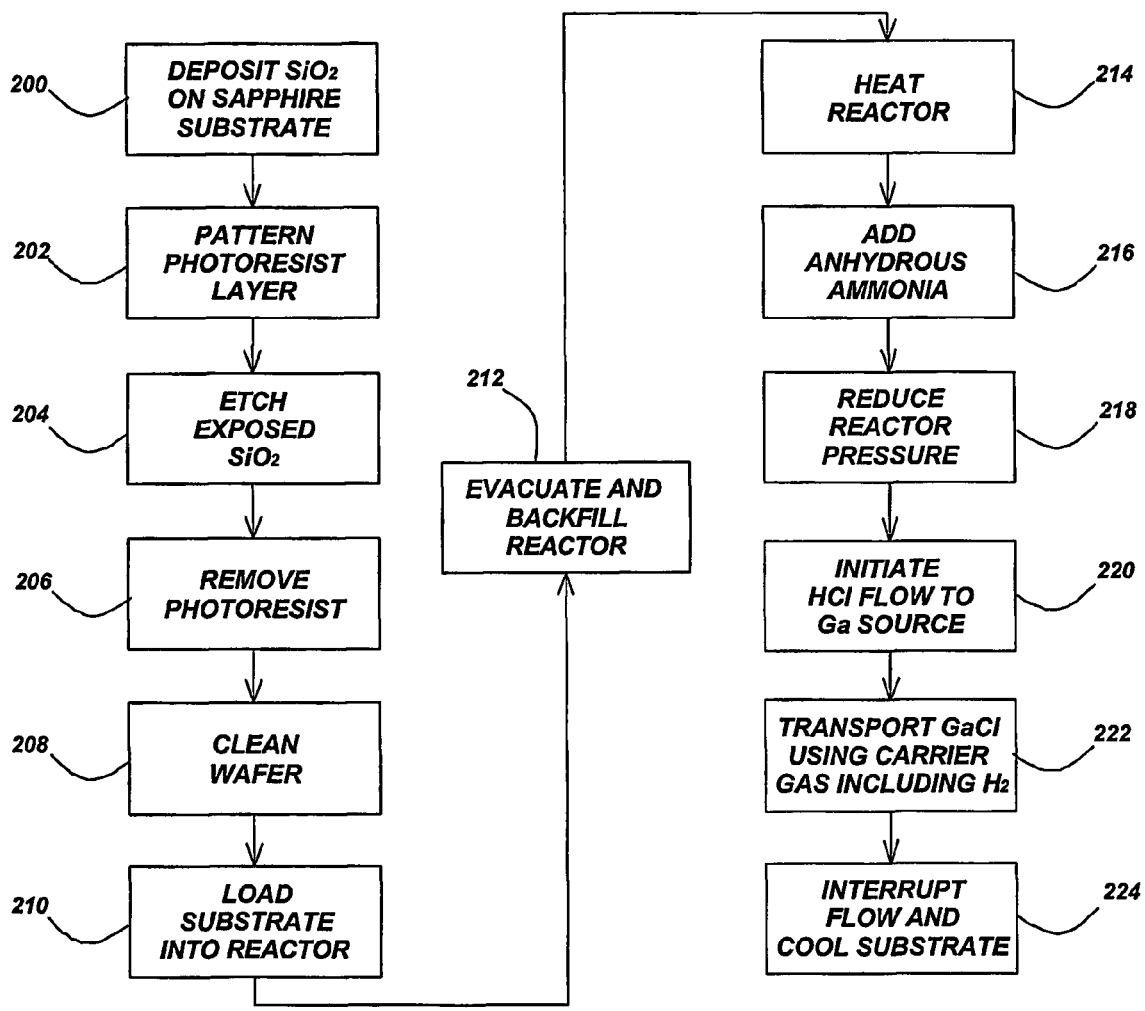
FIG. 2 is a flowchart that illustrates a method of performing a lateral epitaxial overgrowth of a planar, non-polar, a-plane gallium nitride (GaN) film according to the preferred embodiment of the present invention.

FIG. 2 is a flowchart that illustrates a method of performing a lateral epitaxial overgrowth of a planar, non-polar, a-plane GaN film according to the preferred embodiment of the present invention. These steps comprise patterning a mask deposited on a substrate (Blocks 200–208 below), and performing a lateral epitaxial overgrowth of the GaN film off the substrate using hydride vapor phase epitaxy (Blocks 210–224 below), wherein the GaN film nucleates only on portions of the substrate not covered by the patterned mask, the GaN film grows vertically through openings in the patterned mask, and the GaN film then spreads laterally above the patterned mask and across the substrate's surface.

Block 200 represents the step of depositing a 1300 Å-thick $SiO_2$ film on a 430 μm thick polished r-plane ($1\bar{1}02$) sapphire substrate, wherein the $SiO_2$ film provides the basis for the dielectric mask. Although, in the preferred embodiment, the patterned mask is a dielectric, and the substrate is an r-plane sapphire substrate, other materials may be used as well, such as a metallic material for the patterned mask or silicon carbide (SiC) for the substrate.

Block 202 represents the step of depositing a photoresist layer on the $SiO_2$ film and patterning the deposited photoresist layer using conventional photolithography processing steps. In one embodiment, the pattern comprises 35 μm wide stripes separated by 5 μm wide openings.

Block 204 represents the step of etching away any portions of the $SiO_2$ film exposed by the patterned photoresist layer by soaking the substrate in buffered hydrofluoric (HF) acid for two minutes.

Block 206 represents the step of removing remaining portions of the photoresist layer using acetone.

Block 208 represents the step of cleaning the substrate using acetone, isopropyl alcohol, and deionized water.

After drying, the substrate is covered by a patterned mask comprising the patterned $SiO_2$ film having 35 μm wide stripes separated by 5 μm wide openings.

The following Blocks represent the steps of performing a lateral epitaxial overgrowth of the GaN film off the substrate using HVPE, wherein the GaN film nucleates only on portions of the substrate exposed by the patterned mask, the GaN film grows vertically through openings in the patterned mask, and the GaN film then spreads laterally above the patterned mask and across the substrate's surface, eventually converging with adjacent GaN stripes. The lateral epitaxial overgrowth utilizes reduced growth pressures of approximately atmospheric pressure (760 Torr) and a carrier gas containing a fraction of hydrogen.

These steps, and the growth parameters therefor, are described in more detail in the co-pending and commonly-assigned International Application No. PCT/US03/21916, entitled "GROWTH OF PLANAR, NON-POLAR A-PLANE GALLIUM NITRIDE BY HYDRIDE VAPOR PHASE EPITAXY," filed on same date herewith, by Benjamin A. Haskell, Paul T. Fini, Shigemasa Matsuda, Michael D. Craven, Steven P. DenBaars, James S. Speck, and Shuji Nakamura, which application claims priority to co-pending and commonly-assigned U.S. Provisional Patent Application Ser. No. 60/433,844, entitled "TECHNIQUE FOR THE GROWTH OF PLANAR, NON-POLAR A-PLANE GALLIUM NITRIDE BY HYDRIDE VAPOR PHASE EPITAXY," filed on Dec. 16, 2002, by Benjamin A. Haskell, Paul T. Fini, Shigemasa Matsuda, Michael D. Craven, Steven P. DenBaars, James S. Speck, and Shuji Nakamura, and U.S. Provisional Patent Application Ser. No. 60/433,843, entitled "GROWTH OF REDUCED DISLOCATION DENSITY NON-POLAR GALLIUM NITRIDE BY HYDRIDE VAPOR PHASE EPITAXY," filed on Dec. 16, 2002, by Benjamin A. Haskell, Michael D. Craven, Paul T. Fini, Steven P. DenBaars, James S. Speck, and Shuji Nakamura, which applications are incorporated by reference herein. See also References 9–10.

Block 210 represents the step of loading the substrate into a reactor.

Block 212 represents the step of evacuating the reactor and backfilling the reactor with purified nitrogen ($N_2$) gas to reduce oxygen levels therein. This step is frequently repeated to further reduce residual oxygen levels within the reactor.

Block 214 represents the step of heating the reactor to a growth temperature of approximately 1040° C., with a mixture of $H_2$ and $N_2$ flowing through all channels in the system.

Block 216 represents the step of nitridating the sapphire substrate, once the reactor reaches the growth temperature, wherein the nitridating step comprises adding anhydrous ammonia ($NH_3$) to a gas stream in the reactor to nitridate the surface of the sapphire substrate.

Block 218 represents the step of reducing the reactor's pressure to a desired deposition pressure. In the preferred embodiment, the desired deposition pressure is below atmospheric pressure (760 Torr), and is generally less than 300 Torr. More specifically, the desired deposition pressure may be restricted to a range of 5–100 Torr, and may be set to 76 Torr.

Block 220 represents the step of initiating a gaseous hydrogen chloride (HCl) flow to a gallium (Ga) source to begin growth of the a-plane GaN film directly on the sapphire substrate without the use of any low-temperature buffer or nucleation layers. Conventional metal source HVPE involves an in situ reaction of a halide compound, such as (but not limited to), gaseous HCl with the metallic Ga at a temperature in excess of 700° C. to form gallium monochloride (GaCl).

Block 222 represents the step of transporting the GaCl to the substrate by a carrier gas that includes at least a fraction of hydrogen ($H_2$) in one or more of the gas streams in the reactor. In one embodiment, the carrier gas may be predominately hydrogen, while in other embodiments the carrier gas comprises a mixture of hydrogen and nitrogen, argon, helium or other inert gases. Either in transport to the substrate, at the substrate, or in an exhaust stream, the GaCl reacts with the $NH_3$ to form the GaN film. Reactions that occur at the substrate have the potential to yield the GaN film on the substrate, thereby resulting in crystal growth. Typical V/III ratios are 1–50 for this process. Note that the $NH_3$/HCl ratio need not equal the V/III ratio due to supplemental HCl injection downstream of the Ga source or incomplete reaction of HCl with the Ga source.

Block 224 represents, after a desired growth time has elapsed, the step of interrupting the gaseous HCl flow, reducing the reactor's temperature to room temperature, and returning the reactor pressure to atmospheric pressure. The system pressure may be either atmospheric or reduced during this cooling phase. The interrupting step further comprises including NH3 in a gas stream to prevent decomposition of the GaN film during the reduction of the reactor's temperature.

Preferably, the above process steps create a lateral epitaxial overgrowth of a planar, non-polar, a-plane gallium nitride (GaN) film off the substrate. Moreover, the above process steps are used to manufacture a free-standing a-plane GaN film or substrate. Devices manufactured using this method include laser diodes, light-emitting diodes and transistors.

Experimental Results

In experiments by the inventors, a variety of dielectric mask patterns were used to produce 8–125 μm-thick, fully coalesced non-polar GaN films. The nanometer-scale pit densities in the overgrown regions were less than $3 \times 10^6$ cm$^{-2}$ as compared to ~$10^{10}$ cm$^{-2}$ in the direct-growth a-plane GaN. Cathodoluminescence (CL) revealed a four-fold increase in luminous intensity in the overgrown material compared to the wing material. X-ray rocking curves indicated that the films were free of wing tilt within the sensitivity of the measurements. Whereas non-LEO a-plane GaN exhibits basal plane stacking fault and threading dislocation densities of $10^5$ cm$^{-1}$ and $10^9$ cm$^{-2}$, respectively, the LEO material was essentially free of extended defects. The basal plane stacking fault and threading dislocation densities in the wing regions were below the sampling limits of ~$5 \times 10^6$ cm$^{-2}$ and $3 \times 10^3$ cm$^{-1}$, respectively.

Figure 3:
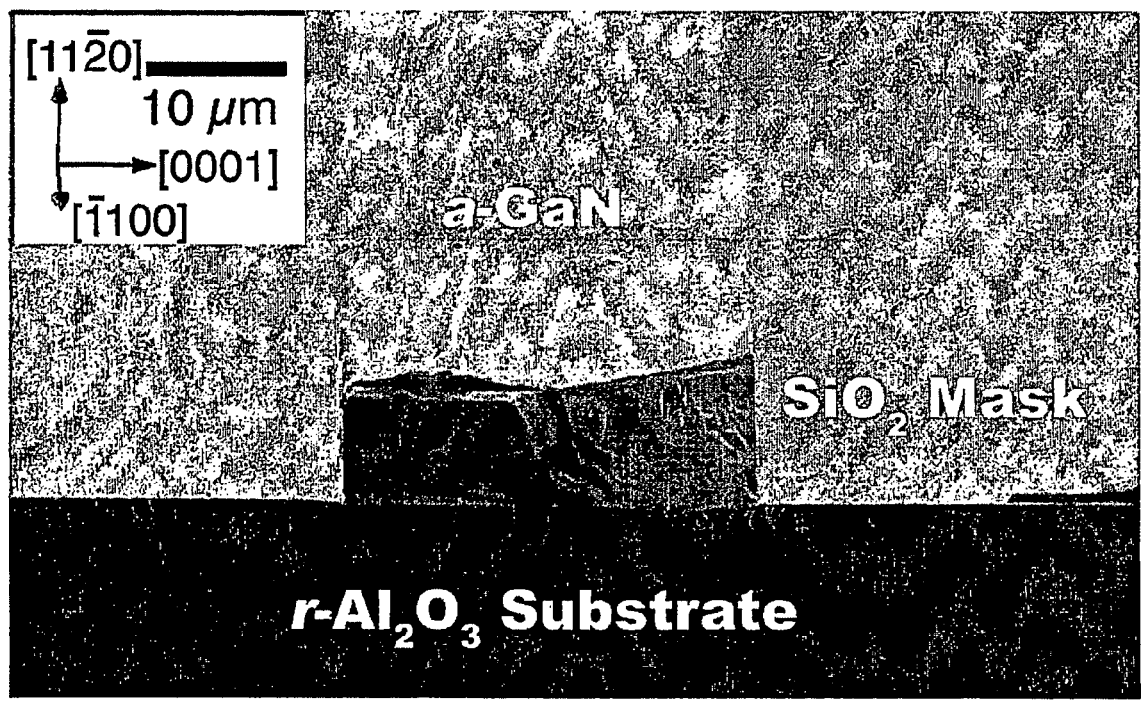
FIG. 3 is a cross-sectional scanning electron micrograph (SEM) image of an a-plane GaN stripe.

FIG. 3 is a cross-sectional scanning electron micrograph (SEM) image of an a-plane GaN stripe grown using the process described above. This stripe has grown through a 5 μm wide window in the SiO$_2$ mask and has spread laterally over the SiO$_2$ mask to a width of approximately 30 μm. If this growth had been continued for a sufficient time, this stripe would have converged with adjacent stripes to form a continuous a-plane GaN surface. The coalesced film will have lower dislocation and stacking fault densities in the overgrown regions due to blocking of dislocations by the mask or bending of dislocations through the transition from vertical to lateral growth. (Note that the chipped edge of the stripe is a cleaving artifact.)

The masks for the LEO process were prepared by utilizing conventional photolithographic processing and wet etching to ~1300 Å-thick plasma-enhanced chemical vapor deposited SiO$_2$ layers. A variety of mask designs were investigated, including arrays of circular apertures, parallel stripes oriented along the $[0001]_{GaN}$ direction, parallel stripes oriented along the $[1\bar{1}00]_{GaN}$ direction, parallel stripes oriented along the $[1\bar{1}02]_{GaN}$ direction, and non-parallel stripes in a 'wagon-wheel' pattern. The LEO growth process was carried out in a conventional three-zone horizontal directed-flow HVPE system. (See Reference 9.) Typical vertical growth rates ranged from 16 to 50 μm per hour at a substrate temperature of ~1040° C. A variety of mask geometries yielded coalesced films; in particular the use of masks consisting of periodic arrays of $[1\bar{1}00]$-oriented stripes allowed full 50 mm-diameter a-plane GaN wafers to be coalesced.

Figure 4:
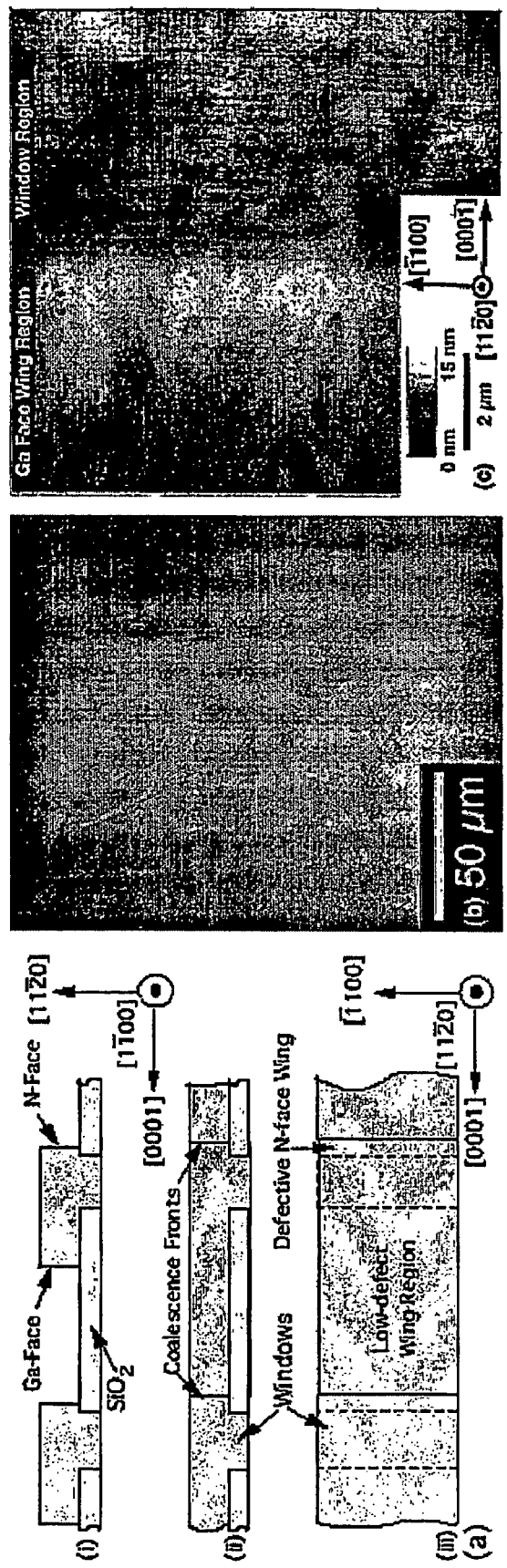
FIG. 4(a) is a schematic representation of a [1$\bar{1}$00] stripe geometry.
FIG. 4(b) is an optical contrast micrograph of a 20 μm-thick coalesced LEO film formed with [1$\bar{1}$00]-oriented stripes.
FIG. 4(c) is a 10×10 μm atomic force micrography topograph of two coalesced stripes.

FIG. 4(a) gives a schematic representation of the $[1\bar{1}00]$ stripe geometry that was used for the samples to be discussed below. Interrupted growths have shown that the (0001) Ga-face wing advances roughly 6 times as rapidly as the (000$\bar{1}$) N-face wing. This ratio indicates that the relative growth rate of the (000$\bar{1}$) wing is measurably greater in HVPE growth compared to MOCVD growth of GaN, in which the ratio of Ga- to N-face growth is ~10. (See Reference 19.) One benefit of the large difference in lateral growth rates between the {0001} faces is that the coalescence front was offset towards the N-face side of the window region, yielding a broad wing region uninterrupted by defective coalescence fronts.

FIG. 4(b) shows a Nomarski™ optical contrast micrograph of a 20 μm-thick coalesced LEO film formed with [1$\bar{1}$00]-oriented stripes. The faint "fish scale"-like feature on the upper portion of the image demonstrated that the film's surface is in focus, while the refractive index contrast from the SiO$_2$ allowed the out-of-focus mask pattern to be observed.

Atomic force microscopy (AFM) was performed to compare the surface morphology in the window and wing regions of the a-plane LEO films. FIG. 4(c) shows a 10×10 μm AFM topograph of two coalesced stripes. The window region appeared as the darker band of pitted material, with the coalescence front roughly 1 μm to the left of the window. The Ga-face wing, apparent on the left side of the image, had superior surface quality, exhibiting average pit densities of less than $3 \times 10^6$ cm$^{-2}$, compared to ~$10^9$ cm in the window regions. The root-mean-square (RMS) roughness of the wing regions was less than 0.9 nm, compared to 1.3 nm in the window regions.

Figure 5:
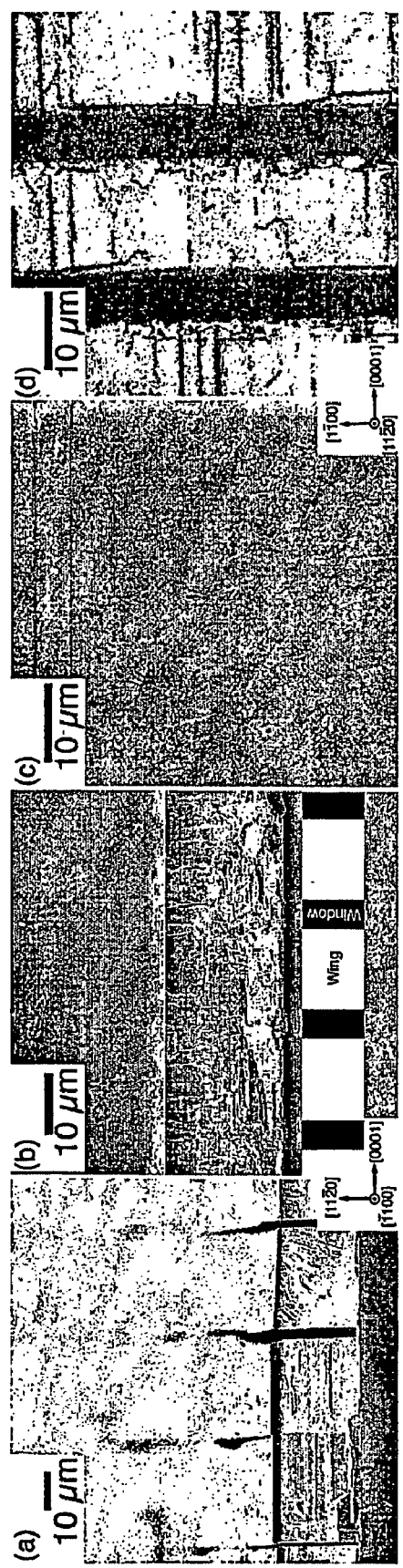
FIGS. 5(a) and (b) are cross-sectional SEM images of LEO wafers patterned with a periodic array of [1$\bar{1}$00]$_{GaN}$-oriented SiO$_2$ stripes.
FIG. 5(c) is a plan-view SEM image of a coalesced film.
FIG. 5(d) is a cathodoluminescence (CL) image of a coalesced film.

FIG. 5(a) and (b) are cross-sectional SEM images of LEO wafers patterned with a periodic array of $[1\bar{1}00]_{GaN}$-oriented SiO$_2$ stripes. The inclined cross-section in FIG. 5(a) demonstrates the sharply vertical {0001} sidewalls that are prevalent for [1$\bar{1}$00]-oriented stripes throughout lateral growth and immediately preceding coalescence. FIG. 5(b) shows a cross-section view of four coalesced GaN stripes. Only contrast variation at the film-template-interface due to charging effects allows the window and wing regions to be distinguished. FIG. 5(c) is a plan-view SEM image of a coalesced film, again with a mask of SiO$_2$ stripes oriented along the GaN [1$\bar{1}$00] direction. The surface was flat and almost featureless, except for a few faint irregular ridges. These ridges manifested themselves in the corresponding CL image in FIG. 5(d) as dark lines due to scattering. FIG. 5(d) is a CL image of the surface in FIG. 5(c) imaged at the GaN band edge of 365 nm, with lighter shades of grey indicating greater luminous intensity. The window regions in the CL image are apparent as the dark vertical bands. Because of the proximity of the coalescence front to the windows, large, relatively defect-free regions result from the use of [1$\bar{1}$00] stripes, providing ample surface area for the fabrication of devices. The narrow, dark stripes oriented along the <0001> direction did not appear to correspond to surface features. The cause of this decreased luminescence is a point of ongoing investigation, though preliminary transmission electron microscopy (TEM) results indicate that clusters of stacking faults lying on the prismatic {1$\bar{1}$00} planes may account for these dark lines.

The structural quality of the a-plane LEO films was characterized by x-ray diffraction (XRD) and TEM. X-ray rocking curves of the 11$\bar{2}$0 GaN reflection taken perpendicular to the LEO stripe direction were single-peaked, indicating a lack of measurable tilt in the coalesced films. Narrowing of both on-axis and off-axis reflections was observed in the LEO films compared to planar a-plane GaN films grown directly on r-plane sapphire. (See Reference 19.) Typical full widths at half maximum (FWHM) for the 11$\bar{2}$0 and 10$\bar{1}$0 reflections were 750 and 1250 arcsec, respectively.

Figure 6:
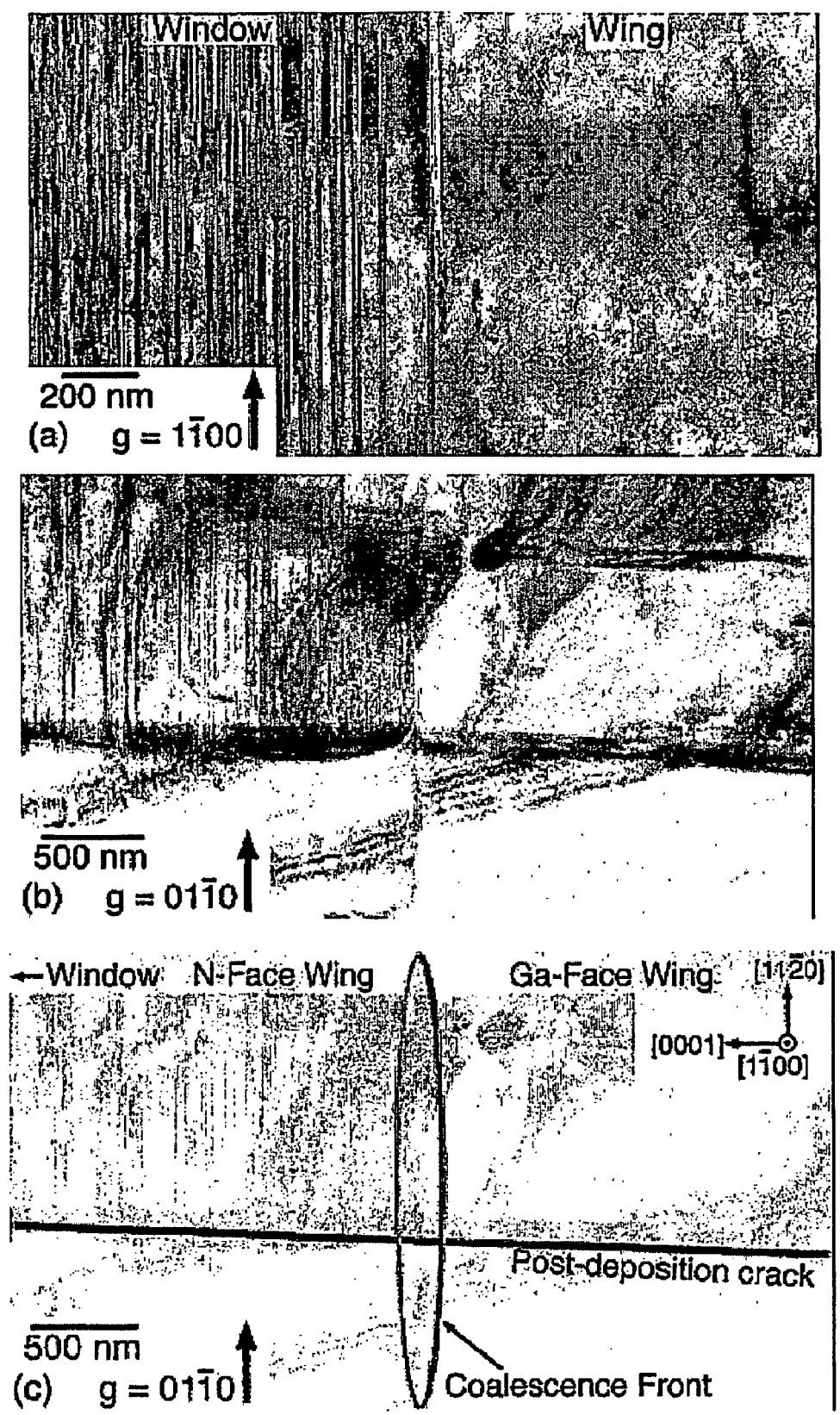
FIGS. 6(a), (b) and (c) show plan-view and cross-sectional TEM images of a LEO film imaged with g vectors of 1$\bar{1}$00 and 01$\bar{1}$0.

FIGS. 6(a), (b) and (c) show plan-view and cross-sectional TEM images of a LEO film imaged with g vectors of $1\bar{1}00$ and $01\bar{1}0$, respectively. In agreement with observations from AFM and CL, the window regions exhibited high threading dislocation (~$9\times10^9$ cm$^{-2}$) and basal plane stacking fault (~$4\times10^5$ cm$^{-1}$) densities. In contrast, the Ga-face wing region was essentially free of both dislocations and stacking faults, with densities below the images' sampling limits of ~$5\times10^6$ cm$^{-2}$ and ~$3\times10^3$ cm$^{-1}$, respectively. The N-face wing region was also threading dislocation-free, though basal plane stacking faults and Shocldey partial dislocations terminating the faults remained prevalent.

The above-described results have demonstrated that substantial reduction in morphological and structural defects in a-plane GaN may be readily achieved by LEO with HVPE. The reduction in threading dislocation density in the overgrown GaN is accompanied by a significant improvement in surface morphology and luminescence compared to non-LEO planar a-plane GaN. Coupling LEO with the comparably high growth rates achievable by HVPE bodes well for the fabrication of high-quality non-polar gallium nitride substrates.

REFERENCES

The following references are incorporated by reference herein.

1. T. Nishida and N. Kobayashi, Phys. Stat. Sol. (a), 188 (1), 113 (2001).
2. S. Nakamura, G. Fasol, and S. J. Pearton, *The Blue Laser Diode*. New York: Springer, 2000.
3. L. F. Eastman and U. K. Mishra, IEEE Spectrum, 39 (5), 28 (2002).
4. P. Waltereit, O. Brandt, A. Trampert, H. T. Grahn, J. Menniger, M. Ramsteiner, M. Reiche, and K. H. Ploog, Nature (London), 406, 865 (2000).
5. M. D. Craven, P. Waltereit, F. Wu, J. S. Speck, and S. P. DenBaars, Jpn. J. Appl. Phys., 42 (3A) L235 (2003).
6. H. M. Ng, Appl. Phys. Lett., 80 (23) 4369 (2002).
7. K. Motoki, T. Okahisa, N. Matsumoto, M. Matsushima, H. Kimura, H. Kasai, K. Takemoto, K. Uematsu, T. Hirano, M. Nakayama, S. Nakahata, M. Ueno, D. Hara, Y. Kumagai, A. Koukitu, and H. Seki, Jpn. J. Appl. Phys. Part 2, 40 (2B), L140 (2001).
8. T. Paskova, P. P. Paskov, V. Darakchieva, S. Tungasmita, J. Birch, and B. Monemar, Phys. Stat. Sol. (a) 183 (1) 197 (2001).
9. B. A. Haskell, F. Wu, M. D. Craven, S. Matsuda, P. T. Fini, S. P. DenBaars, J. S. Speck, and S. Nakamura, Submitted for Publication
10. F. Wu, M. D. Craven, S. H. Lim, and J. S. Speck, submitted for publication.
11. T. S. Zheleva, N. Ok-Hyun, M. D. Bremser, and R. F. Davis, Appl. Phys. Lett. 71 (17), 2472 (1997).
12. N. Ok-Hyun, M. D. Bremser, T. S. Zheleva, and R. F. Davis, Appl. Phys. Lett. 71 (18) 2638 (1997).
13. H. Marchand, J. P. Ibbetson, P. T. Fini, P. Kozodoy, S. Keller, S. DenBaars, J. S. Speck, and U. K Mishra, MRS Internet J. Nitride Semicond. Res. 3, 3 (1998).
14. H. Marchand, X. H. Wu, J. P. Ibbetson, P. T. Fini, P. Kozodoy, S. Keller, J. S. Speck, S. P. DenBaars, and U. K. Mishra, Appl. Phys. Lett. 73 (6) 747 (1998).
15. A. Sakai, H. Sunakawa, A. Kimura, and A. Usui, Appl. Phys. Lett., 76 (4) 442 (2000).
16. O. Parillaud, V. Wagner, H. Bühlmann, and M. Ilegems, MRS Internet J. Nitride Semicond. Res., 3, 40 (1998).
17. G. Nataf, B. Beaumont, A. Bouille, S. Haffouz, M. Vaille, and P. Gibart, J. Cryst. Growth, 192, 73 (1998).
18. H. Tsuchiya, K. Sunaba, T. Suemasu, and F. Hasegawa, J. Cryst. Growth, 189/90, 395 (1998).
19. M. D. Craven, S. H. Lim, F. Wu, J. S. Speck, and S. P. DenBaars, Appl. Phys. Lett., 81 (7) 1201 (2002).

CONCLUSION

This concludes the description of the preferred embodiment of the present invention. The following describes some alternative embodiments for accomplishing the present invention.

The preferred embodiment describes a direct one-step lateral overgrowth process in which the a-plane GaN is grown directly off of a patterned sapphire substrate. Alternative suitable substrate materials, including but not limited to a-plane silicon carbide, may be used in practicing the present invention.

The substrate for the lateral growth process may also consist of a suitable substrate that has been coated with a "template" layer of GaN, AlN, AlGaN, or other thin film. The use of such templates for subsequent regrowth has been established as a viable technique for the practice of the present invention.

Nucleation layers deposited at either low temperatures or at or above the growth temperature by a variety of growth techniques may also be used for subsequent lateral overgrowth by HVPE using this technique.

The preferred embodiment utilizes a carrier gas containing predominantly hydrogen. While a fraction of hydrogen must be present over the growth surface, other gases may be present in the carrier gas stream, including (but not limited to) nitrogen, argon, or helium.

Additionally, a variety of mask materials, mask deposition techniques, and patterning methods may be used in the practice of this invention without significantly altering the results of the invention. Indeed, both dielectric materials such as silicon dioxide and silicon nitride, and metallic materials such as titanium, can be utilized as masks in the practice of this invention.

Another alternative approach is to etch a pattern into the substrate material rather than deposit a patterned mask on the substrate by, for example, reactive ion etching. In such an approach, the depth and width of the trenches in the substrate, as well as the system pressure and specifically ammonia partial pressure, should be chosen such that the film growing laterally from the unetched plateaus coalesce before the GaN growing from the bottom of the trenches reaches the top of the trenches. This technique, known as cantilever epitaxy, has been demonstrated for polar c-plane GaN growth, and should be compatible with the present invention.

The geometry of the mask pattern described herein significantly affects the behavior of the laterally growing film. Masks containing stripes with various orientations relative to the substrate have been used, in addition to apertures of various sizes, shapes, and spacings. While the growth behavior from each shape opening differs, it has been shown that the mask geometry does not fundamentally alter the practice of this invention. Thus, any mask containing some regions where GaN nucleation is preferred and some regions where GaN nucleation is discouraged is acceptable, irrespective of geometry.

Reactor geometry and design may affect the practice of the present invention, as discussed further in the co-pending and commonly-assigned International Application No. PCT/

US03/21916, entitled "GROWTH OF PLANAR, NON-POLAR A-PLANE GALLIUM NITRIDE BY HYDRIDE VAPOR PHASE EPITAXY," filed on same date herewith, by Benjamin A. Haskell, Paul T. Fini, Shigemasa Matsuda, Michael D. Craven, Steven P. DenBaars, James S. Speck, and Shuji Nakamura, which application claims priority to co-pending and commonly-assigned U.S. Provisional Patent Application Ser. No. 60/433,844, entitled "TECHNIQUE FOR THE GROWTH OF PLANAR, NON-POLAR A-PLANE GALLIUM NITRIDE BY HYDRIDE VAPOR PHASE EPITAXY," filed on Dec. 16, 2002, by Benjamin A. Haskell, Paul T. Fini, Shigemasa Matsuda, Michael D. Craven, Steven P. DenBaars, James S. Speck, and Shuji Nakamura, and U.S. Provisional Patent Application Ser. No. 60/433,843, entitled "GROWTH OF REDUCED DISLOCATION DENSITY NON-POLAR GALLIUM NITRIDE BY HYDRIDE VAPOR PHASE EPITAXY," filed on Dec. 16, 2002, by Benjamin A. Haskell, Michael D. Craven, Paul T. Fini, Steven P. DenBaars, James S. Speck, and Shuji Nakamura, which applications are incorporated by reference herein. However, it should be mentioned that the growth parameters required for the successful lateral overgrowth of non-polar GaN may vary from reactor to reactor. Such variations do not fundamentally alter the general practice of this invention.

Additionally, while in general it is desirable to continue the lateral growth process to the point of film coalescence, coalescence is not a requirement of the present invention. Indeed, it is envisioned that there may be a number of applications in which uncoalesced laterally-overgrown non-polar GaN stripes or pillars would be highly desirable. Therefore, the present invention applies to both coalesced and uncoalesced laterally overgrown non-polar GaN films.

Finally, the processes described herein may be scaled for multiple wafer growth. Specifically, the present invention may be practiced through the growth of films on multiple wafers simultaneously.

In summary, the present invention describes defect reduction in non-polar GaN grown by HVPE, thereby significantly improving film quality and allowing fabrication of enhanced GaN substrate layers for subsequent non-polar device fabrication.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method of performing a lateral epitaxial overgrowth of a planar, non-polar, a-plane gallium nitride (GaN) film, comprising:
   (a) patterning a mask deposited on a substrate; and
   (b) performing a lateral epitaxial overgrowth of the planar, non polar, a-plane GaN film off the substrate using hydride vapor phase epitaxy, wherein the planar, non polar, a-plane GaN film nucleates only on portions of the substrate not covered by the patterned mask, the planar, non polar, a-plane GaN film grows vertically through openings in the patterned mask, and the planar, non polar, a-plane GaN film then spreads laterally above the patterned mask and across the substrate's surface.

2. The method of claim 1, wherein the lateral epitaxial overgrowth utilizes growth pressures of approximately atmospheric pressure (760 Torr) or below, and a carrier gas containing a fraction of hydrogen.

3. The method of claim 1, wherein the lateral epitaxial overgrowth reduces threading dislocation densities in the planar, non polar, a-plane GaN film.

4. The method of claim 1, wherein the substrate comprises sapphire.

5. The method of claim 1, wherein the patterned mask is comprised of a metallic material.

6. The method of claim 1, wherein the patterned mask is comprised of a dielectric material.

7. The method of claim 1, wherein the patterned mask is a silicon dioxide ($SiO_2$) mask containing apertures or stripes allowing access to the substrate underlying the mask.

8. The method of claim 1, wherein the patterning step comprises:
   depositing a silicon dioxide ($SiO_2$) film on the substrate;
   patterning a photoresist layer on the silicon dioxide film;
   etching away any portions of the silicon dioxide film exposed by the patterned photoresist layer;
   removing remaining portions of the photoresist layer; and
   cleaning the substrate.

9. The method of claim 1, wherein the substrate is coated with a template layer of GaN, aluminum nitride (AlN), aluminum gallium nitride (AlGaN), or other thin film.

10. The method of claim 1, wherein the substrate is a free-standing a-plane GaN, a-plane aluminum nitride (AlN), or a-plane aluminum gallium nitride (AlGaN) wafer.

11. The method of claim 1, wherein the substrate is coated with a nucleation layer deposited at either low temperatures or at the growth temperature.

12. A free-standing a-plane GaN film or substrate manufactured using the method of claim 1.

13. A device manufactured using the method of claim 1.

14. The method of claim 1, wherein the the planar, non polar, a-plane GaN film then spreads laterally above the patterned mask and across the substrat's surface in a manner that creates sharply vertical sidewalls.

15. The method of claim 2, wherein the growth pressure is less than 300 Torr.

16. The method of claim 2, wherein the growth pressure ranges from 5 to 100 Torr.

17. The method of claim 2, wherein the carrier gas is predominantly hydrogen.

18. The method of claim 2, wherein the carrier gas comprises a mixture of hydrogen and nitrogen, argon, or helium.

19. The device of claim 13, wherein the device is a laser diode, light-emitting diode or transistor.

20. A lateral epitaxial overgrowth of a planar, non-polar, a-plane gallium nitride (GaN) film off a substrate, wherein the lateral epitaxial overgrowth is created using a process comprising:
   (a) patterning a dielectric mask deposited on a substrate; and
   (b) performing a lateral epitaxial overgrowth of the planar, non polar, a-plane GaN film off the substrate using hydride vapor phase epitaxy, wherein the planar, non polar, a-plane GaN film nucleates only on portions of the substrate exposed by the patterned dielectric mask, the planar, non polar, a-plane GaN film grows vertically through openings in the patterned dielectric mask, and the planar, non polar, a-plane GaN film then spreads laterally above the patterned dielectric mask and across the substrate's surface.

21. The lateral epitaxial overgrowth of claim 20, wherein the planar, non polar, a-plane GaN film then spreads laterally above the patterned dielectric mask and across the substate's surface in a manner that creates sharply vertical sidewalls.

* * * * *

UNITED STATES PATENT AND TRADEMARK OFFICE
CERTIFICATE OF CORRECTION

PATENT NO.        : 7,220,658 B2
APPLICATION NO. : 10/537644
DATED             : May 22, 2007
INVENTOR(S)      : Haskell et al.

It is certified that error appears in the above-identified patent and that said Letters Patent is hereby corrected as shown below:

<u>Title page</u>,

Item [73] insert after Assignee: The Regents of the University of California, Oakland, CA (US), --Japan Science and Technology Agency, Kawaguchi City, Saitama Prefecture (JP)--.

Signed and Sealed this

Twenty-seventh Day of January, 2009

JOHN DOLL
*Acting Director of the United States Patent and Trademark Office*